(12) United States Patent
Jeong et al.

(10) Patent No.: US 9,831,081 B2
(45) Date of Patent: Nov. 28, 2017

(54) METHOD FOR TREATING SUBSTRATE

(71) Applicant: Samsung Electronics Co., Ltd., Suwon-si, Gyeonggi-do (KR)

(72) Inventors: Jihoon Jeong, Suwon-si (KR); Jung-Min Oh, Incheon (KR); Kuntack Lee, Suwon-si (KR); Hyosan Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/176,972

(22) Filed: Jun. 8, 2016

(65) Prior Publication Data
US 2017/0069485 A1     Mar. 9, 2017

(30) Foreign Application Priority Data

Sep. 4, 2015  (KR) .......................... 10-2015-0125595

(51) Int. Cl.
*H01L 21/02* (2006.01)
*H01L 21/311* (2006.01)

(52) U.S. Cl.
CPC .. *H01L 21/02057* (2013.01); *H01L 21/02052* (2013.01); *H01L 21/02101* (2013.01); *H01L 21/31111* (2013.01)

(58) Field of Classification Search
CPC ......... H01L 21/02057; H01L 21/02052; H01L 21/02101; H01L 21/31111
See application file for complete search history.

(56) References Cited

U.S. PATENT DOCUMENTS

| | | | |
|---|---|---|---|
| 6,213,853 B1* | 4/2001 | Gonzalez-Martin | .... B24B 37/04 257/E21.228 |
| 6,703,316 B2 | 3/2004 | Inoue et al. | |
| 6,843,855 B2 | 1/2005 | Verhaverbeke | |
| 7,752,999 B2 | 7/2010 | Nakashima et al. | |
| 8,080,114 B2 | 12/2011 | Han et al. | |
| 8,235,061 B2 | 8/2012 | Toshima et al. | |
| 2012/0064727 A1 | 3/2012 | Oh et al. | |
| 2013/0327363 A1* | 12/2013 | Inadomi | ............ H01L 21/67034 134/26 |
| 2014/0144462 A1* | 5/2014 | Verhaverbeke | ... H01L 21/67034 134/1.2 |
| 2014/0283886 A1 | 9/2014 | Cho et al. | |
| 2015/0139758 A1 | 5/2015 | Ito et al. | |
| 2015/0268660 A1 | 9/2015 | Hirato | |

FOREIGN PATENT DOCUMENTS

| | | |
|---|---|---|
| JP | 2014078676 A | 5/2014 |
| JP | 2014241450 A | 12/2014 |
| KR | 20090035947 A | 4/2009 |
| KR | 20110080967 A | 7/2011 |
| KR | 101184808 B1 | 9/2012 |
| KR | 20150023254 A | 3/2015 |

* cited by examiner

*Primary Examiner* — Duy Deo
(74) *Attorney, Agent, or Firm* — Harness, Dickey & Pierce, P.L.C.

(57) ABSTRACT

In embodiment, the method includes cleaning a preceding substrate, and drying the preceding substrate and cleaning a next substrate. Drying the preceding substrate and cleaning the next substrate include determining a cleaning start time of the next substrate, and the cleaning start time corresponds to a desired time point after starting drying the preceding substrate.

19 Claims, 7 Drawing Sheets

METHOD FOR TREATING SUBSTRATE

CROSS-REFERENCE TO RELATED APPLICATION

This U.S. non-provisional patent application claims priority under 35 U.S.C. §119 to Korean Patent Application No. 10-2015-0125595, filed on Sep. 4, 2015, in the Korean Intellectual Property Office, the disclosure of which is hereby incorporated by reference in its entirety.

BACKGROUND

The example embodiments of inventive concepts relate to a method for manufacturing a semiconductor device and, more particularly, to a method for wet-treating a substrate.

As design rules of semiconductor devices have been reduced, various problems have been caused. For example, when a cleaning solution in a wet cleaning process is dried, various defects (e.g., collapse of patterns and/or contact between the patterns) may occur by surface tension of the cleaning solution. A supercritical drying process may replace the cleaning solution disposed on a substrate, with a supercritical fluid to prevent the collapse and contact defects of the patterns. However, a process time of the supercritical drying process may be longer than that of the cleaning process.

SUMMARY

Some example embodiments of inventive concepts may provide a method for treating a substrate capable of reducing or eliminating dry waiting time.

According to at least one example embodiment, the method may comprise cleaning a preceding substrate; and drying the preceding substrate and cleaning a next substrate, such that a time for drying the preceding substrate is longer than a time for cleaning the preceding substrate, and the drying the preceding substrate and the cleaning the next substrate including, starting drying the preceding substrate; and determining a cleaning start time of the next substrate, the cleaning start time corresponding to a desired time point after the starting drying the preceding substrate.

According to at least one example embodiment, the drying the preceding substrate and the cleaning the next substrate may further comprise cleaning the next substrate after determining the cleaning start time of the next substrate; determining whether the drying the preceding substrate and the cleaning the next substrate are completed; and determining whether another substrate to be cleaned exists when the drying the preceding substrate and the cleaning the next substrate are completed.

According to at least another example embodiment, the drying the preceding substrate and the cleaning the next substrate may further comprise recognizing the next substrate and the another substrate as a preceding substrate and a next substrate, respectively, when the another substrate exists.

According to at least another example embodiment the drying the preceding substrate and the cleaning the next substrate may further comprise recognizing the next substrate as a last substrate when the another substrate does not exist.

According to at least another example embodiment further comprising: drying the last substrate.

According to at least another example embodiment, the cleaning the next substrate may comprise etching the next substrate; and rinsing the next substrate.

According to at least some example embodiments the drying the preceding substrate may comprise increasing pressure of a supercritical fluid provided to the preceding substrate; maintaining a saturated supercritical fluid on the preceding substrate; and reducing pressure of the saturated supercritical fluid on the preceding substrate before cleaning the next substrate is completed.

According to at least some example embodiments, the reducing the pressure of the saturated supercritical fluid may comprise reducing the pressure of the supercritical fluid at a first rate; and reducing the pressure of the supercritical fluid at a second rate, wherein the rinsing the next substrate and the reducing the pressure of the supercritical fluid at the second rate are started at a same time.

According to at least some example embodiments, the etching the next substrate may be started during the maintaining of the saturated supercritical fluid.

According to at least some example embodiments, the cleaning start time of the next substrate may be calculated based on a time for the cleaning the preceding substrate.

According to at least some example embodiments, the method may comprise cleaning a preceding substrate; drying the preceding substrate and cleaning a next substrate, such that a time for the drying the preceding substrate is longer than a time for cleaning the preceding substrate, and the drying the preceding substrate and cleaning the next substrate comprises, starting drying the preceding substrate; determining a cleaning start time of the next substrate, the cleaning start time corresponding to desired time point after the starting drying the preceding substrate; cleaning the next substrate from the cleaning start time of the next substrate; and determining whether the drying the preceding substrate and the cleaning the next substrate are completed, drying a last substrate when the next substrate is the last substrate.

According to at least some example embodiments, the cleaning the next substrate may comprise etching the next substrate; and rinsing the next substrate.

According to at least some example embodiments, the drying the preceding substrate may comprise increasing pressure of a supercritical fluid provided to the preceding substrate after starting drying the preceding substrate; maintaining a saturated the supercritical fluid on the preceding substrate; and reducing pressure of the saturated supercritical fluid on the preceding substrate before cleaning the next substrate is completed.

According to at least some example embodiments, the reducing the pressure of the saturated supercritical fluid may comprise reducing the pressure of the supercritical fluid at a first rate; and reducing the pressure of the supercritical fluid at a second rate, wherein the rinsing the next substrate and reducing the pressure of the supercritical fluid at the second rate are started at a same time.

According to at least some example embodiments, the drying the preceding substrate and the cleaning the next substrate may further comprise determining whether another substrate to be cleaned exists when the drying the preceding substrate and the cleaning the next substrate are completed; and recognizing the next substrate and the another substrate as a preceding substrate and a next substrate, respectively, when the another substrate exists According to at least some example embodiments, the method may comprise drying the preceding substrate in a drying chamber; cleaning a next substrate in a cleaning chamber; and controlling the drying of the preceding substrate and the cleaning the next substrate such that the cleaning the next substrate starts after a pressure of a supercritical fluid reaches a saturated point in the drying chamber and stops when the pressure of the supercritical fluid decreases to zero from the saturated point in the drying chamber.

According to at least some example embodiments, the drying the preceding substrate and the cleaning the next substrate further may comprise determining whether another substrate to be cleaned exists when the drying the preceding substrate and the cleaning the next substrate are completed.

According to at least some example embodiments, the drying the preceding substrate and the cleaning the next substrate may further comprise recognizing the next substrate and the another substrate as a preceding substrate and a next substrate, respectively, when the another substrate exists; and repeating the cleaning the another substrate and the drying the next substrate.

According to at least some example embodiments, the drying the preceding substrate and the cleaning the next substrate may further comprise recognizing the next substrate as a last substrate when the another substrate does not exist, and drying the last substrate.

BRIEF DESCRIPTION OF THE DRAWINGS

The example embodiments of inventive concepts will become more apparent in view of the attached drawings and accompanying detailed description.

DETAILED DESCRIPTION OF THE EMBODIMENTS

Some example embodiments of inventive concepts will now be described more fully hereinafter with reference to the accompanying drawings. The advantages and features of the inventive concepts and methods of achieving them will be apparent from the following example embodiments that will be described in more detail with reference to the accompanying drawings. It should be noted, however, that the example embodiments of inventive concepts are not limited to the folio rig example embodiments, and may be implemented in various forms. Accordingly, the example embodiments are provided only to disclose the inventive concepts and let those skilled in the art know the category of the inventive concepts. In the drawings, example embodiments of inventive concepts are not limited to the specific examples provided herein and are exaggerated for clarity.

The same reference numerals or the same reference designators denote the same elements throughout the specification.

The terminology used herein is for the purpose of describing particular embodiments only and is not intended to limit the disclosure. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
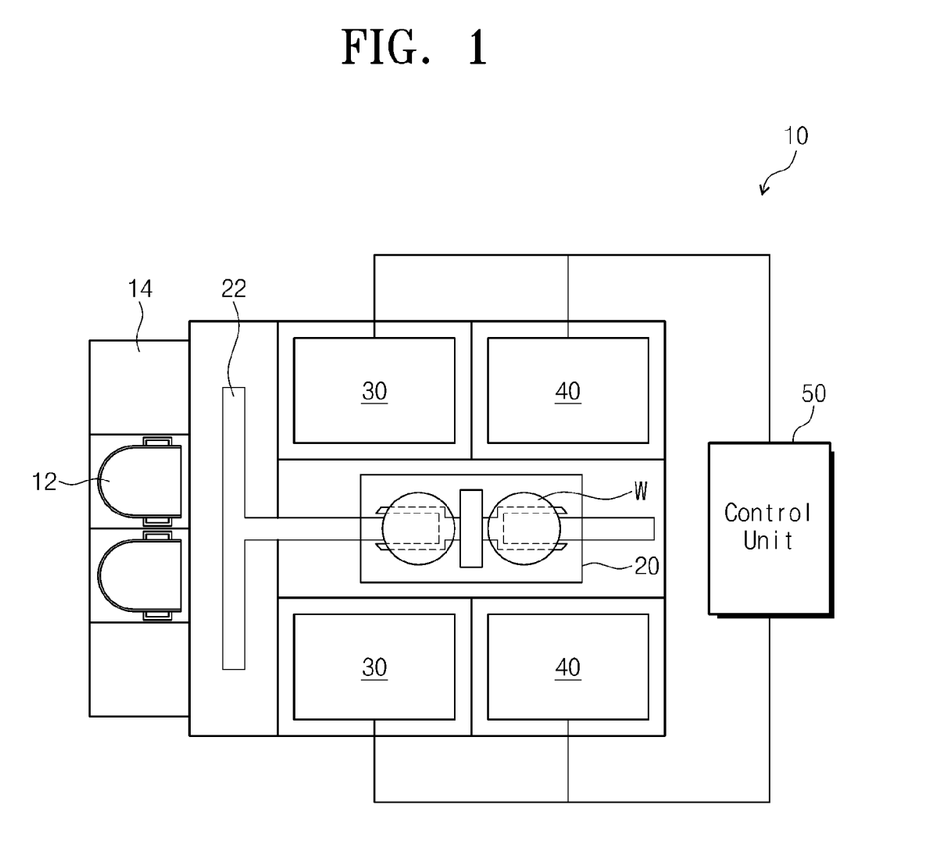
FIG. 1 is a plan view illustrating a substrate treating system according t example embodiment of inventive concepts.

FIG. 1 is a plan view illustrating a substrate treating system 10 according to an example embodiment of inventive concepts.

Referring to FIG. 1, the substrate treating system 10 may include a wet process system. In example embodiments, the substrate treating system 10 may include a substrate transfer apparatus 20, cleaning apparatuses 30, drying apparatuses 40, and a control unit 50. The substrate transfer apparatus 20 may transfer substrates W to the cleaning apparatuses 30 and the drying apparatuses 40 along a guide rail 22. Substrates W may be loaded into and/or unloaded from carriers 12 disposed on load ports 14 by the substrate transfer apparatus 20. The cleaning apparatuses 30 may be disposed adjacently to the drying apparatuses 40, respectively. The cleaning apparatuses 30 may clean substrates W using a wet-clean process. The drying apparatuses 40 may dry the cleaned substrates W. The control unit 50 may control the substrate transfer apparatus 20, the cleaning apparatuses 30, and the drying apparatuses 40.

Figure 2:
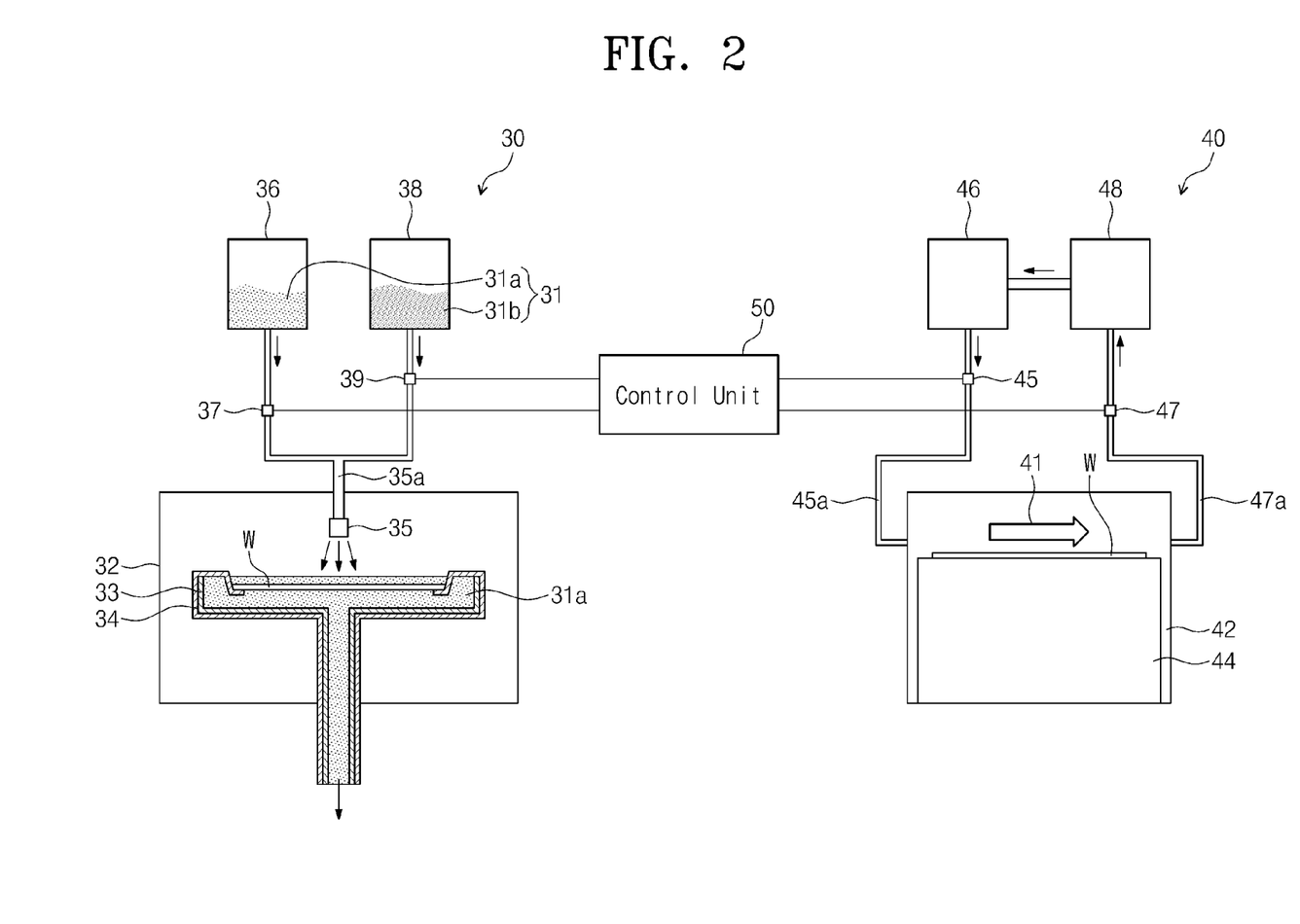
FIG. 2 illustrates a cleaning apparatus, a drying apparatus, and a control unit of FIG. 1.

FIG. 2 illustrates the cleaning apparatus 30, the drying apparatus 40, and the control unit 50 of HG. 1.

Referring to FIG. 2, the cleaning apparatus 30 may include a wet-cleaning apparatus. In an example embodiment, the cleaning apparatus 30 may include a cleaning chamber 32, a flattener 33, a first substrate holder 34, a cleaning solution nozzle 35, an etching solution supply unit 36, a rinse solution supply unit 38, and first and second valves 37 and 39.

A substrate W may be provided into the cleaning chamber 32. The flattener 33 may be disposed in the cleaning chamber 32. The flattener 33 may temporarily store a cleaning solution 31. The cleaning solution 31 may include an etching solution 31a and a rinse solution 31b. The etching solution 31a may etch the substrate W. For example, the etching solution 31a may include a strong acid solution such as hydrochloric acid, phosphoric acid, sulfuric acid, and/or nitric acid. The rinse solution 31b may remove the etching solution 31a disposed on the substrate W. The rinse solution 31b may include deionized water.

The first substrate holder 34 may immerse the substrate W in the etching solution 31a and/or the rinse solution 31b of the flattener 33. The substrate W may be rotated in the etching solution 31a and/or the rinse solution 31b by the first substrate holder 34. The substrate W may be etched in proportion to a time for which the substrate W is immersed in the etching solution 31a. In one example embodiment, the substrate W may be etched in proportion to a rotational speed at which the substrate W is rotated in the etching solution 31a.

The cleaning solution nozzle 35 may be disposed over the substrate W in the cleaning chamber 32. The etching solution 31a and/or the rinse solution 31b may be provided to the substrate W through the cleaning solution nozzle 35.

The etching solution supply unit 36 and the rinse solution supply unit 38 may be connected to the cleaning solution nozzle 35 in the cleaning chamber 32. The etching solution supply unit 36 may store the etching solution 31a. The rinse solution supply unit 38 may store the rinse solution 31b. The etching solution supply unit 36 may supply the etching solution 31a to the cleaning solution nozzle 35, and the rinse solution supply unit 38 may supply the rinse solution 31b to the cleaning solution nozzle 35.

The first valve 37 may be installed on a cleaning solution supply line 35a between the etching solution supply unit 36 and the cleaning solution nozzle 35. The first valve 37 may permit or prohibit the supply of the etching solution 31a in response to a control signal of the control unit 50. For example, when the first valve 37 is opened, the substrate W may be etched. The control unit 50 may control the etching process of the substrate W.

The second valve 39 may be installed on a cleaning solution supply line 35a between the rinse solution supply unit 38 and the cleaning solution nozzle 35. The second valve 39 may permit or prohibit the supply of the rinse solution 31b in response to a control signal of the control unit 50. For example, when the second valve 39 is opened, the substrate W may be rinsed. The control unit 50 may control the rinsing process of the substrate W. In one example embodiment, the controller 50 may control the first and second valves 37 and 39 to be in opposite states. In other word, when the first valve 37 is opened, the second valve 39 may be closed. On the contrary, when the first valve 37 is closed, the second valve 39 may be opened. When the cleaning process of the substrate W is completed, the first and second valves 37 and 39 may be closed. The cleaning solution 31 may be exhausted through an exhaust pipe connected to a bottom of the flattener 33.

Referring to FIG. 2, the drying apparatus 40 may include a supercritical drying apparatus. In one example embodiment, the drying apparatus 40 may include a drying chamber 42, a second substrate holder 44, a supercritical fluid supply unit 46, a supercritical fluid collection unit 48, and third and fourth valves 45 and 47.

A substrate W may be provided into the drying chamber 42. The drying cha her 42 may temporarily store a supercritical fluid 41. The supercritical fluid 41 may be provided to the top surface of the substrate W.

The second substrate holder 44 may be disposed in the drying chamber 42. The second substrate holder 44 may hold the substrate W.

The supercritical fluid supply unit 46 may provide the supercritical fluid 41 into the drying chamber 42. The supercritical fluid 41 may be provided to the substrate W. In an example embodiment, the supercritical fluid 41 may be provided at a pressure of about 0 atmospheres to about 150 atmospheres. The rinse solution 31b disposed on the substrate W may be replaced with the supercritical fluid 41. The supercritical fluid 41 may include carbon dioxide. When pressure becomes low, the supercritical fluid 41 may be evaporated without surface tension.

The supercritical fluid collection unit 48 may collect the supercritical fluid 41 from the drying chamber 42. The supercritical fluid collection unit 48 and the supercritical fluid supply unit 46 may be connected to each other. The supercritical fluid collection unit 48 may provide the collected supercritical fluid 41 to supercritical fluid supply unit 46. The supercritical fluid 41 may be circulated through the supercritical fluid supply unit 46, the drying chamber 42, and the supercritical fluid collection unit 48.

The third valve 45 may be installed on a supercritical fluid supply line 45a between the supercritical fluid supply unit 46 and the drying chamber 42. The third valve 45 may control the supply of the supercritical fluid 41 in response to a control signal of the control unit 50.

The fourth valve 47 may be installed on a supercritical fluid collection line 47a between the supercritical fluid collection unit 48 and the drying chamber 42. The fourth valve 47 may control the collection of the supercritical fluid 41 in response to a control signal of the control unit 50. Thus, the control unit 50 may control the drying process of the substrate W.

A method according to one embodiment, for treating a substrate using the substrate treating system 10 described above will be described hereinafter.

Figure 3:
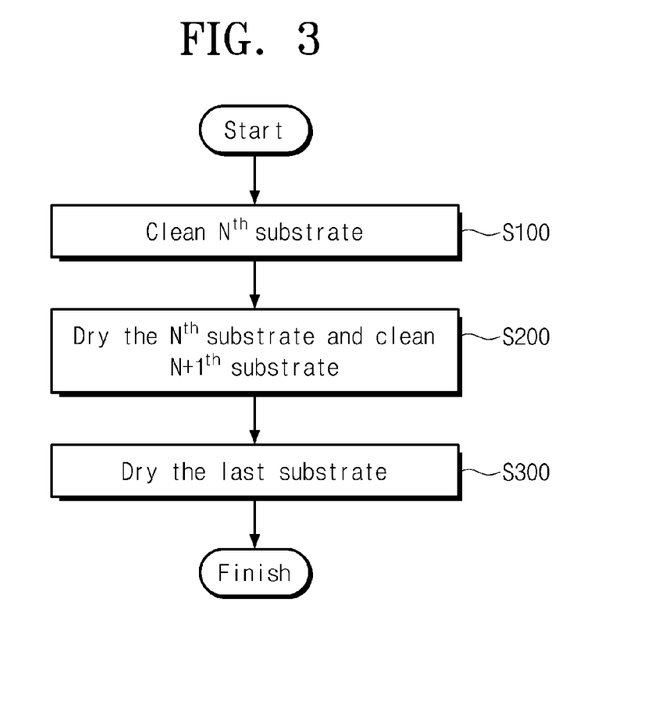
FIG. 3 is a flow chart illustrating a method for treating a substrate using the substrate treating system of FIG. 1, according to an example embodiment of inventive concepts.

FIG. 3 is a flow chart illustrating a method for treating a substrate using the substrate treating system 10 of FIG. 1, according to an example embodiment of inventive concepts.

Referring to FIGS. 1 to 3, the method for treating a substrate may include a method for cleaning a substrate W and a method for drying the substrate W. In one example embodiment, the method for treating a substrate may include cleaning an $N^{th}$ substrate (S100), drying the $N^{th}$ substrate and cleaning an $N+1^{th}$ substrate (S200), and drying the last substrate (S300). Here, the $N^{th}$ substrate may be a preceding substrate, and the $N+1^{th}$ substrate may be a next substrate. "N" may be a natural number, First, the control unit 50 may control the substrate treating system 10 to clean the $N^{th}$ substrate (S100). For example, a first substrate may be cleaned. Next, the control unit 50 may control the substrate treating system 10 to dry the $N^{th}$ substrate and to clean the $N+1^{th}$ substrate (S200). In other word, according to an example embodiment the method for treating a substrate may comprise drying the preceding substrate in a drying chamber and cleaning a next substrate in a cleaning chamber.

In an example embodiment, a drying time of the $N^{th}$ substrate may be longer than a. cleaning time of the $N^{th}$ substrate. The cleaning time of the $N^{th}$ substrate may be equal to a cleaning time of the $N+1^{th}$ substrate. The control unit 50 may control the substrate treating system 10 to repeatedly perform the drying of the $N^{th}$ substrate and the cleaning of the $N+1^{th}$ substrate until the $N+1^{th}$ substrate is verified as the last substrate. In other word, the step S200 may be repeatedly performed until the cleaned substrate W is verified as the last substrate. For example, the first substrate may be dried. A second substrate may be cleaned while the first substrate is dried. Thereafter, a third substrate may be cleaned while the second substrate is dried.

In step S200 (see FIG. 5 described below), when the $N+1^{th}$ substrate is verified as the last substrate, the control unit 50 may control the substrate treating system 10 to dry the last substrate in step S300. When the third substrate is the last substrate, the third substrate may be dried in the step S300.

Figure 4:
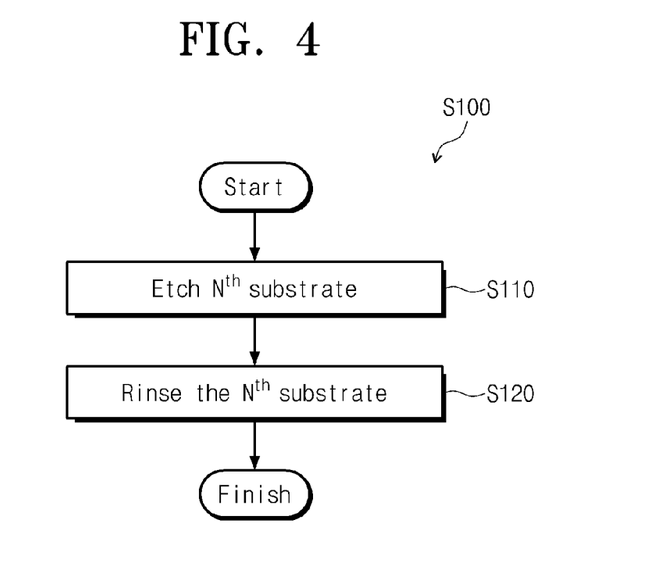
FIG. 4 is a flow chart illustrating a step S100 of FIG. 3 according to an example embodiment of inventive concepts.

FIG. 4 is a flow chart illustrating a step S100 of FIG. 3 according to an example embodiment of inventive concepts.

Referring to FIGS. 1 to 4, cleaning the $N^{th}$ substrate (S100) may include etching the $N^{th}$ substrate (S110) and rinsing the $N^{th}$ substrate (S120). Etching the $N^{th}$ substrate (S110) may include providing the etching solution 31a to the $N^{th}$ substrate. The $N^{th}$ substrate may be etched in proportion to a time for which the $N^{th}$ substrate is exposed to the etching solution 31a. Rinsing the $N^{th}$ substrate (S120) may include providing the rinse solution 31b to the $N^{th}$ substrate.

Figure 5:
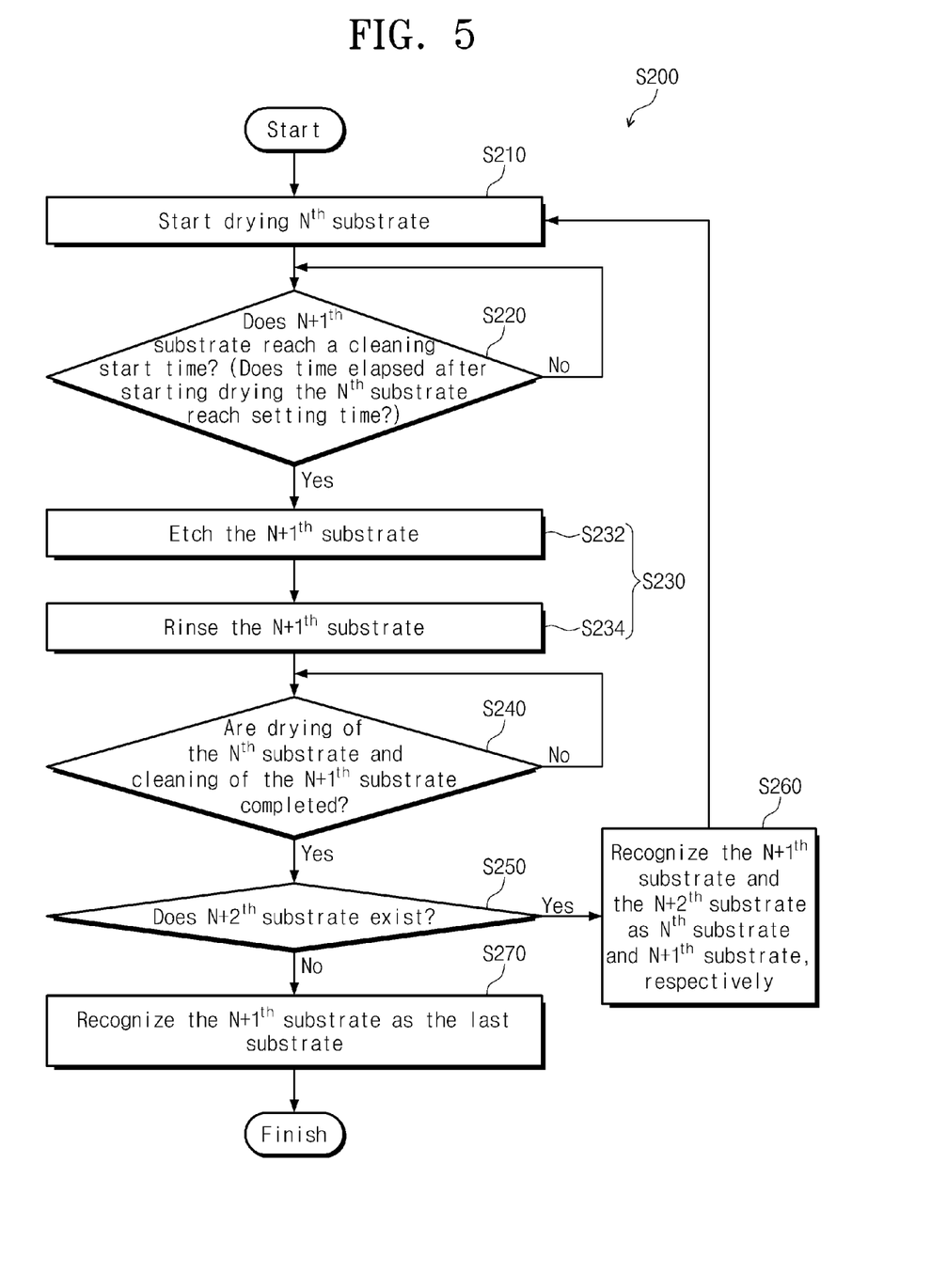
FIG. 5 is a flow chart illustrating a step S200 of FIG. 3 according to an example embodiment of inventive concepts.

FIG. 5 is a flow chart illustrating a step S200 of FIG. 3 according to an example embodiment of inventive concepts.

Referring to FIGS. 1 to 3 and 5, drying the $N^{th}$ substrate and cleaning the $N+1^{th}$ substrate (S200) may include starting drying the $N^{th}$ substrate (S210), determining a cleaning start time of the $N+1^{th}$ substrate (S220), cleaning the $N+1^{th}$ substrate (S230), determining whether drying of the $N^{th}$ substrate and cleaning of the $N+1^{th}$ substrate are completed (S240), determining whether cleaning of an $N+2^{th}$ substrate is required (S250), recognizing the $N+1^{th}$ substrate and the $N+2^{th}$ substrate as an $N^{th}$ substrate and an $N+1^{th}$ substrate, respectively (S260), and recognizing the $N+1^{th}$ substrate as the last substrate (S270). The $N+2^{th}$ substrate may be a substrate different from the $N^{th}$ substrate and the $N+1^{th}$ substrate.

Figure 6:
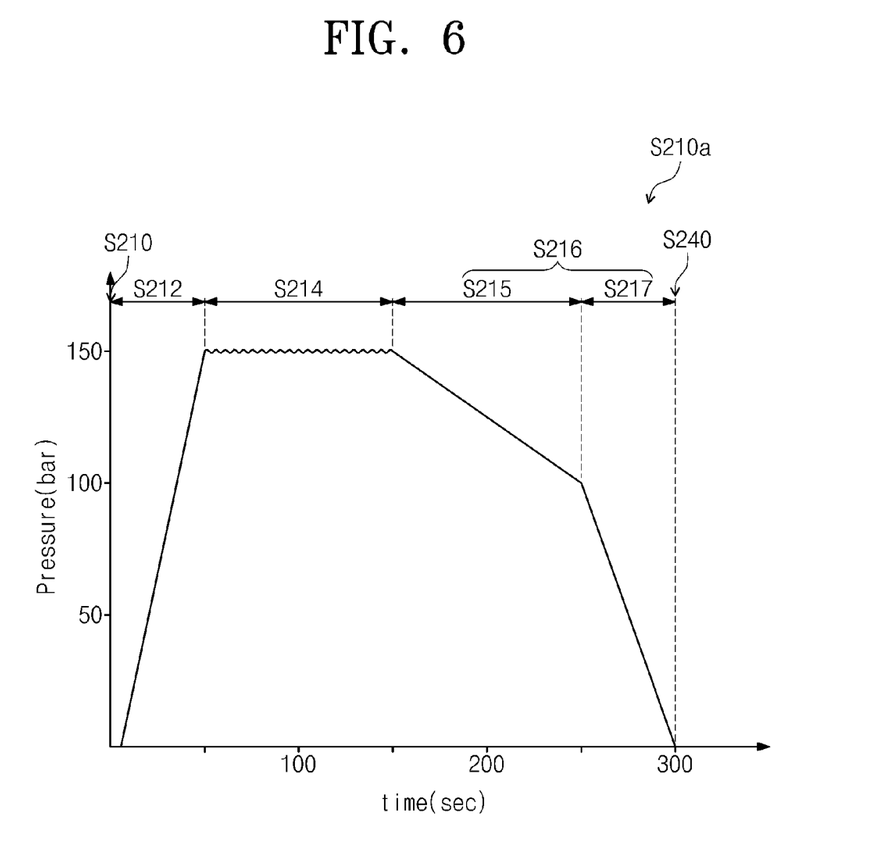
FIG. 6 is a graph illustrating a step of drying an $N^{th}$ substrate between a step S210 and a step S240 of FIG. 5.

The control unit 50 may control the substrate treating system 10 such that the cleaned $N^{th}$ substrate is transferred from the cleaning apparatus 30 into the drying apparatus 40 and drying the $N^{th}$ substrate is started (S210). The control unit 50 may control the substrate treating system 10 to dry the $N^{th}$ substrate from the step S210 to the step S230, FIG. 6 is a graph illustrating a step of drying the $N^{th}$ substrate between a step S210 and a step S240 of FIG. 5.

Referring to FIGS. 1 to 3, 5, and 6, drying the $N^{th}$ substrate (S210a) may include increasing pressure of the supercritical fluid 41 (S212), maintaining a saturated supercritical fluid 41 (S214), and reducing pressure of the saturated supercritical fluid 41 (S216).

In other word, according to an example embodiment the method for treating a substrate may comprise controlling the drying of the preceding substrate and the cleaning the next substrate such that the cleaning the next substrate starts after a pressure of a supercritical fluid reaches a saturated point in the drying chamber and stops when the pressure of the supercritical fluid decreases to zero from the saturated point in the drying chamber.

In an example embodiment, the supercritical fluid 41 may be provided to the $N^{th}$ substrate, simultaneously with the drying start S210. In an example embodiment, after the drying chamber 42 is pumped simultaneously with the drying start in S210, the supercritical fluid 41 may be provided to the $N^{th}$ substrate. The pressure of the supercritical fluid 41 may be increased (S212). In an example embodiment, the pressure of the supercritical fluid 41 may be increased from about 0 atmospheres to about 150 atmospheres for about 40 seconds.

Next, the saturated supercritical fluid 41 may be maintained (S214). In an example embodiment, pressure of the saturated supercritical fluid 41 may oscillate. In the step S214, the rinse solution 31b on the $N^{th}$ substrate may be replaced with the supercritical fluid 41. In an example embodiment, maintaining the saturated the supercritical fluid 41 (S214) may be performed in a pressure range of about 130 atmospheres to about 150 atmospheres for about 100 seconds.

Next, the pressure of the supercritical fluid 41 may be reduced (S216). Since the pressure of the supercritical fluid 41 is reduced, the supercritical fluid 41 may be evaporated without surface tension. In an example embodiment, reducing the pressure of the saturated supercritical fluid 41 (S216) may include reducing the pressure of the supercritical fluid 41 at a first rate (S215) and reducing the pressure of the supercritical fluid 41 at a second rate (S217). Here, the first rate may be lower than the second rate. The pressure of the supercritical fluid 41 may be slowly reduced from about 150 atmospheres to about 80 atmospheres for about 100 seconds in the step S215, reducing the pressure of the supercritical fluid 41 at the first rate. The pressure of the supercritical fluid 41 may be rapidly reduced from about 80 atmospheres to about 0 atmospheres for about 55 seconds in the step S217, reducing the pressure of the supercritical fluid 41 at the second rate.

Referring again to FIGS. 1 to 3 and 5, the control unit 50 may determine the cleaning start time of the $N+1^{th}$ substrate while the $N^{th}$ substrate is dried (S220). In an example embodiment, the control unit 50 may calculate the cleaning start time of the $N+1^{th}$ substrate based on a required time of the step S100 of cleaning the $N^{th}$ substrate. A time from the drying state of the $N^{th}$ substrate to drying completion of the $N^{th}$ substrate and the required time of the step S100 of cleaning the $N^{th}$ substrate may be stored in the controller 50 (or a memory (not shown) associated with the controller 50) in advance. Thus, the control unit 50 may determine the cleaning start time of the $N+1^{th}$ substrate (S220), which corresponds to a desired (or, alternatively, a predetermined) time point after the drying start of the $N^{th}$ substrate.

Next, the control unit 50 may control the substrate treating system 10 to clean the $N+1^{th}$ substrate (S230). Cleaning the $N+1^{th}$ substrate (S230) may include providing the cleaning solution 31 to the $N+1^{th}$ substrate. In an example embodiment, cleaning the $N+1^{th}$ substrate (S230) may include etching the $N+1^{th}$ substrate (S232) and rinsing the $N+1^{th}$ substrate (S234). Etching the $N+1^{th}$ substrate (S232) may include providing the etching solution 31a to the $N+1^{th}$ substrate. Rinsing the $N+1^{th}$ substrate (S234) may include providing the rinse solution 31b to the $N+1^{th}$ substrate.

Next, the control unit 50 may determine whether the drying of the $N^{th}$ substrate and the cleaning of the $N+1^{th}$ substrate are completed (S240). In an example embodiment, the drying of the $N^{th}$ substrate and the cleaning of the $N+1^{th}$ substrate may be completed at the same time. Thus, the $N+1^{th}$ substrate may be dried without a dry waiting time.

Figure 7:
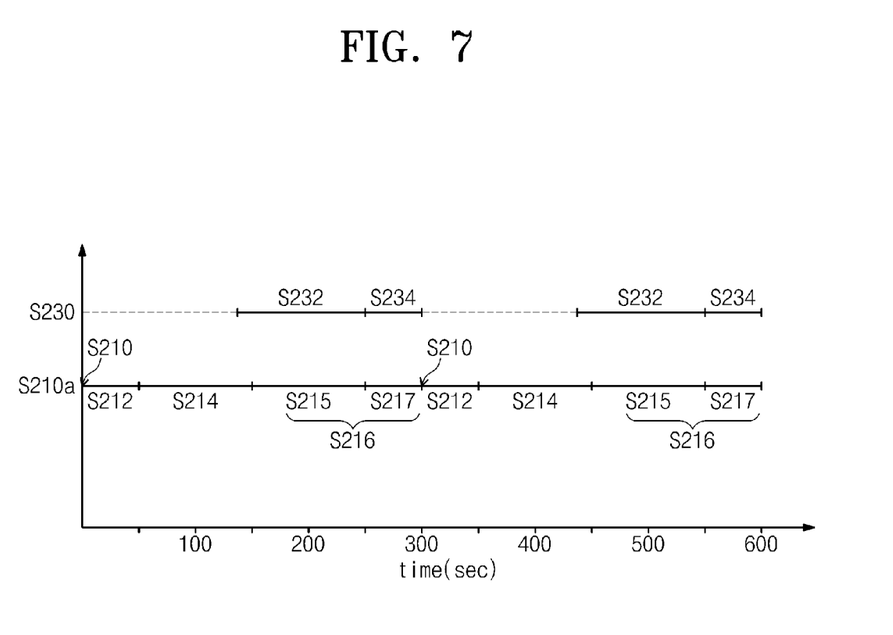
FIG. 7 is a graph illustrating a comparison between a step of cleaning an $N+1^{th}$ substrate of FIG. 5 and the step of drying the $N^{th}$ substrate of FIG. 6.

FIG. 7 is a graph illustrating a comparison between the step S230 of cleaning an $N+1^{th}$ substrate of FIG. 5 and the step S210a of drying the Nth substrate of FIG. 6.

Referring to FIG. 7, drying the $N^{th}$ substrate (S210a) may be continuously performed, but cleaning the $N+1^{th}$ substrate (S230) may be discontinuously performed.

In an example embodiment, the step S232 of etching the N+1 substrate may be started in the step S214 of maintaining the saturated supercritical fluid 41. In an example embodiment, the step S232 of etching the $N+1^{th}$ substrate may be started in the step S212 of increasing the pressure of the supercritical fluid 41.

In an example embodiment, the step S234 of rinsing the N+1 $^{th}$ substrate may be matched with the step S217 of rapidly reducing the pressure of the supercritical fluid 41. For example, the step S234 of rinsing the $N+1^{th}$ substrate and the step S217 of rapidly reducing the pressure of the supercritical fluid 41 may be started at the same time and may be completed at the same time.

Referring to FIGS. 1 to 3 and 5, the control unit 50 may determine whether the $N+2^{th}$ substrate exists (S250).

When the $N+2^{th}$ substrate exists, the $N+1^{th}$ substrate may be recognized as an $N^{th}$ substrate and the $N+2^{th}$ substrate may be recognized as an $N+1^{th}$ substrate (S260). Thereafter, the control unit 50 may control the substrate treating system 10 to start drying the $N^{th}$ substrate (S210). When the $N+2^{th}$ substrate exists, the control unit 50 may control the substrate treating system 10 to repeatedly perform the steps S210 to S260.

When N+2$^{th}$ substrate does not exist, the N+1$^{th}$ substrate may be recognized as the last substrate by the control unit 50 (S270). Subsequently, the control unit 50 may control the substrate treating system 10 to dry the last substrate (S300).

Figure 8:
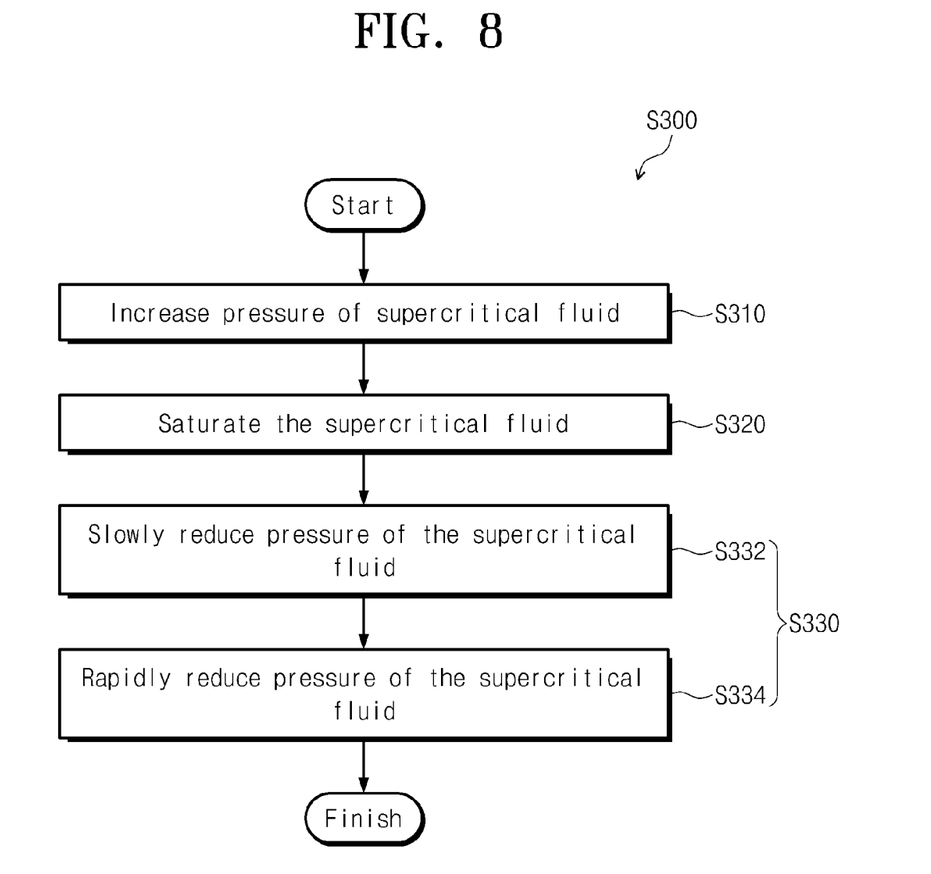
FIG. 8 is a flow chart illustrating a step S300 of FIG. 3 according to an example embodiment of inventive concepts.

FIG. 8 is a flow chart illustrating the step S300 of FIG. 3 according to an example embodiment of inventive concepts.

Referring to FIG. 8, drying the last substrate (S300) may be the same as drying the N$^{th}$ substrate (S210*a*). For example, drying the last substrate (S300) may include increasing pressure of the supercritical fluid (S310), maintained a saturated the supercritical fluid (S320), and reducing the pressure of the saturated supercritical fluid (S330). Reducing the pressure of the saturated supercritical fluid (S330) may include reducing the pressure of the supercritical fluid at a first rate (S332) and reducing the pressure of the supercritical fluid at a second rate (S334). Here, the first rate may be lower than the second rate.

In the method for treating a substrate according to some example embodiments of inventive concepts, the cleaning start time of the next substrate may be determined in the drying process of the preceding substrate, and thus, the drying process of the preceding substrate and the cleaning process of the next substrate may be completed at the same time. As a result, the next substrate may be dried without a dry waiting time.

While some example embodiments of inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for treating a substrate, the method comprising:
   cleaning a preceding substrate via a supercritical fluid; and
   drying the preceding substrate and cleaning a next substrate, such that a time for drying the preceding substrate is longer than a time for cleaning the preceding substrate, and the drying the preceding substrate and the cleaning the next substrate including,
   starting drying the preceding substrate; and
   determining a cleaning start time of the next substrate, the cleaning start time corresponding to a desired time point after the starting drying the preceding substrate, the desired time point being a point at which the supercritical fluid is saturated.

2. The method of claim 1, wherein the drying the preceding substrate and the cleaning the next substrate further comprises:
   cleaning the next substrate after determining the cleaning start time of the next substrate;
   determining whether the drying the preceding substrate and the cleaning the next substrate are completed; and
   determining whether another substrate to be cleaned exists when the drying the preceding substrate and the cleaning the next substrate are completed.

3. The method of claim 2, wherein the drying the preceding substrate and the cleaning the next substrate further comprises:
   recognizing the next substrate and the another substrate as a preceding substrate and a next substrate, respectively, when the another substrate exists.

4. The method of claim 2, wherein the drying the preceding substrate and the cleaning the next substrate further comprises:
   recognizing the next substrate as a last substrate when the another substrate does not exist.

5. The method of claim 4, further comprising:
   drying the last substrate.

6. The method of claim 2, wherein the cleaning the next substrate comprises:
   etching the next substrate; and
   rinsing the next substrate.

7. The method of claim 6, wherein the drying the preceding substrate comprises:
   increasing pressure of the supercritical fluid provided to the preceding substrate;
   maintaining a saturated supercritical fluid on the preceding substrate; and
   reducing pressure of the saturated supercritical fluid on the preceding substrate before cleaning the next substrate is completed.

8. The method of claim 7, wherein the reducing the pressure of the saturated supercritical fluid comprises:
   reducing the pressure of the supercritical fluid at a first rate; and
   reducing the pressure of the supercritical fluid at a second rate,
   wherein the rinsing the next substrate and the reducing the pressure of the supercritical fluid at the second rate are started at a same time.

9. The method of claim 7, wherein the etching the next substrate is started during the maintaining of the saturated supercritical fluid.

10. The method of claim 1, wherein the cleaning start time of the next substrate is calculated based on a time for the cleaning the preceding substrate.

11. A method for treating a substrate, the method comprising:
   cleaning a preceding substrate via a supercritical fluid;
   drying the preceding substrate and cleaning a next substrate, such that a time for the drying the preceding substrate is longer than a time for cleaning the preceding substrate, and the drying the preceding substrate and cleaning the next substrate comprises,
   starting drying the preceding substrate;
   determining a cleaning start time of the next substrate, the cleaning start time corresponding to a desired time point after the starting drying the preceding substrate, the desired time point being a point at which the supercritical fluid is saturated;
   cleaning the next substrate from the cleaning start time of the next substrate; and
   determining whether the drying the preceding substrate and the cleaning the next substrate are completed,
   drying a last substrate when the next substrate is the last substrate.

12. The method of claim 11, wherein the cleaning the next substrate comprises:
   etching the next substrate; and
   rinsing the next substrate.

13. The method of claim 12, wherein the drying the preceding substrate comprises:

increasing pressure of the supercritical fluid provided to the preceding substrate after starting drying the preceding substrate;

maintaining a saturated supercritical fluid on the preceding substrate; and reducing pressure of the saturated supercritical fluid on the preceding substrate before cleaning the next substrate is completed.

14. The method of claim 13, wherein the reducing the pressure of the saturated supercritical fluid comprises:

reducing the pressure of the supercritical fluid at a first rate; and reducing the pressure of the supercritical fluid at a second rate, wherein the rinsing the next substrate and reducing the pressure of the supercritical fluid at the second rate are started at a same time.

15. The method of claim 11, wherein the drying the preceding substrate and the cleaning the next substrate further comprises:

determining whether another substrate to be cleaned exists when the drying the preceding substrate and the cleaning the next substrate are completed; and recognizing the next substrate and the another substrate as a preceding substrate and a next substrate, respectively, when the another substrate exists.

16. A method for treating a substrate, the method comprising:

drying a preceding substrate in a drying chamber;

cleaning a next substrate in a cleaning chamber; and controlling the drying of the preceding substrate and the cleaning the next substrate such that the cleaning the next substrate starts after a pressure of a supercritical fluid reaches a saturated point in the drying chamber and stops when the pressure of the supercritical fluid decreases to zero from the saturated point in the drying chamber.

17. The method of claim 16, wherein the drying the preceding substrate and the cleaning the next substrate further comprises:

determining whether another substrate to be cleaned exists when the drying the preceding substrate and the cleaning the next substrate are completed.

18. The method of claim 17, wherein the drying the preceding substrate and the cleaning the next substrate further comprises:

recognizing the next substrate and the another substrate as a preceding substrate and a next substrate, respectively, when the another substrate exists; and repeating the cleaning the another substrate and the drying the next substrate.

19. The method of claim 17, wherein the drying the preceding substrate and the cleaning the next substrate further comprises:

recognizing the next substrate as a last substrate when the another substrate does not exist, and drying the last substrate.

* * * * *

UNITED STATES PATENT AND TRADEMARK OFFICE
CERTIFICATE OF CORRECTION

PATENT NO. : 9,831,081 B2
APPLICATION NO. : 15/176972
DATED : November 28, 2017
INVENTOR(S) : Jihoon Jeong et al.

Page 1 of 1

It is certified that error appears in the above-identified patent and that said Letters Patent is hereby corrected as shown below:

Column 9 Line 40 Claim 1 should read:
1. A method for treating a substrate, the method comprising:
    cleaning a preceding substrate; and
    drying the preceding substrate via a supercritical fluid and cleaning a next substrate, such that a time for drying the preceding substrate is longer than a time for cleaning the preceding substrate, and the drying the preceding substrate and the cleaning the next substrate including,
        starting drying the preceding substrate; and
        determining a cleaning start time of the next substrate, the cleaning start time corresponding to a desired time point after the starting drying the preceding substrate, the desired time point being a point at which the supercritical fluid is saturated.

Column 10 Line 41 Claim 11 should read:
11. A method for treating a substrate, the method comprising:
    cleaning a preceding substrate;
    drying the preceding substrate via a supercritical fluid and cleaning a next substrate, such that a time for the drying the preceding substrate is longer than a time for cleaning the preceding substrate, and the drying the preceding substrate and cleaning the next substrate comprises,
        starting drying the preceding substrate;
        determining a cleaning start time of the next substrate, the cleaning start time corresponding to a desired time point after the starting drying the preceding substrate, the desired time point being a point at which the supercritical fluid is saturated;
            cleaning the next substrate from the cleaning start time of the next substrate; and
            determining whether the drying the preceding substrate and the cleaning the next substrate are completed,
    drying a last substrate when the next substrate is the last substrate.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*